United States Patent [19]

Hauenstein

[11] 4,334,183

[45] Jun. 8, 1982

[54] ELECTRONIC SENSOR ON/OFF SWITCH

[75] Inventor: Alfred Hauenstein, Munich, Fed. Rep. of Germany

[73] Assignee: Siemens Aktiengesellschaft, Berlin and Munich, Fed. Rep. of Germany

[21] Appl. No.: 151,958

[22] Filed: May 21, 1980

[30] Foreign Application Priority Data

May 31, 1979 [DE] Fed. Rep. of Germany ....... 2922219

[51] Int. Cl.³ .................. G05F 1/45; H03K 17/72
[52] U.S. Cl. .......................... 323/235; 307/252 B; 307/252 UA
[58] Field of Search ........ 307/252 B, 252 UA, 252 N, 307/308; 323/235, 237, 241, 319, 320, 322

[56] References Cited

U.S. PATENT DOCUMENTS

| 3,633,095 | 1/1972 | Hood | 323/319 |
|---|---|---|---|
| 4,050,008 | 9/1977 | Glaser et al. | 323/319 |
| 4,087,697 | 5/1978 | Johnson | 307/252 B |
| 4,218,648 | 8/1980 | Sansum | 323/235 |

Primary Examiner—John Zazworsky
Attorney, Agent, or Firm—Herbert L. Lerner; Laurence A. Greenberg

[57] ABSTRACT

Electronic sensor on/off switch for a load connected to an a-c supply network, including a controlled semiconductor switch connected in a series circuit with the load, a sensor for switching the load on and off, a control circuit connected from the sensor to the switch, the switch being addressable by the control circuit in a conducting state with the load switched on by a signal holding the switch in the conducting state at the zero crossing of a current passing through the load, and in a non-conducting state with the load disconnected by signal switching the switch into the conducting state for switching on the load at the zero crossing of an output a-c voltage at the switch, a power supply circuit connected to the control circuit, a current transformer having a primary and a secondary winding and being operable in saturation, the current transformer being connected in series with the switch, the control circuit including a first rectifier being coupled to the secondary winding and having an output producing a supply voltage with the switch in the conducting state relative to a reference potential equal to a reference potential point of the output a-c voltage, and a branch of the series circuit including the primary winding, the switch, a storage capacitor chargeable by the output a-c voltage and a second rectifier producing the supply voltage in the non-conducting state.

13 Claims, 19 Drawing Figures

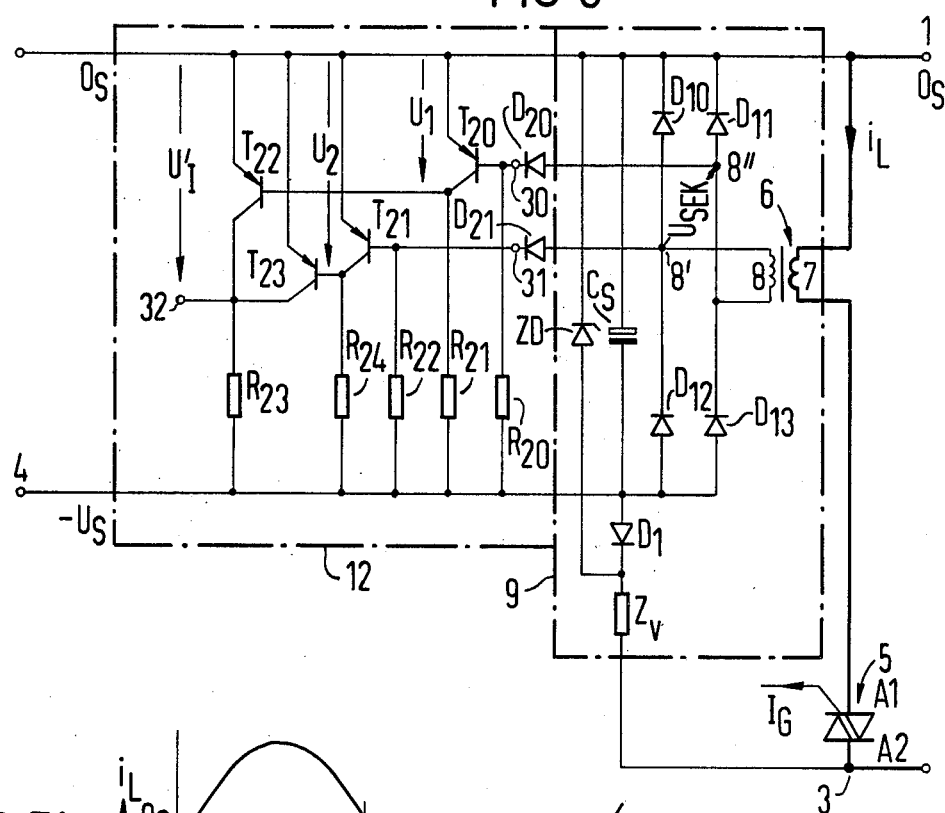
FIG 6
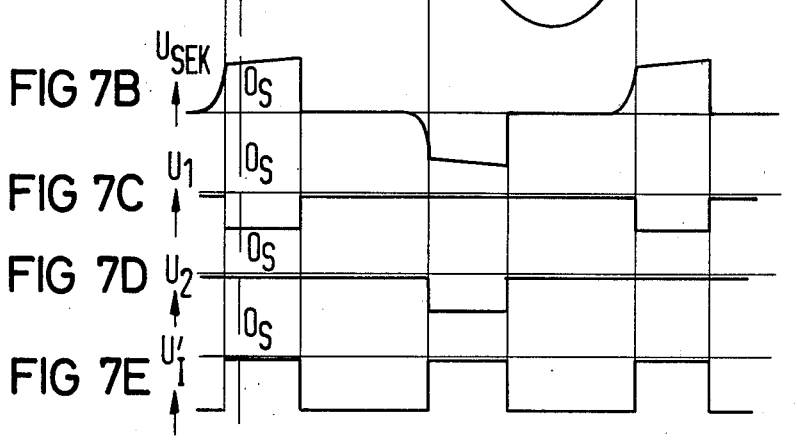
FIG 7A
FIG 7B
FIG 7C
FIG 7D
FIG 7E

ELECTRONIC SENSOR ON/OFF SWITCH

The present invention relates to an electronic sensor on/off switch for a load which is connected to an a-c supply network, particularly in the form of a two-wire line, with a controlled semiconductor switch, particularly a triac which is connected in series with the load and can be addressed by a sensor constructed as a touch-switch for switching the load on and off.

In order to ensure that with on/off switches of the above-mentioned type the largest possible power can be delivered to the load, the switch must not gate the phase of the a-c voltage supplied from the a-c network and of the load a-c current which flows in the on-position. In addition, this is also important for interference reasons, because otherwise expensive radio interference suppression components must be provided.

If on/off switches are connected through two-wire lines, only one pole of the a-c supply network is available at the point of installation. In these cases, the use of electronic on/off switches presents problems because in the "on" condition, the residual voltage at the control semiconductor switch is so small that it is not sufficient for supplying the electronic circuitry with an operating voltage.

It is accordingly an object of the invention to provide an electronic sensor on/off switch which overcomes the hereinafore-mentioned disadvantages of the heretofore-known devices of this general type, and in which the controlled semiconductor switch can be addressed in the off-position as well as in the on-position at zero crossings of the a-c voltage or at the zero crossings of the load a-c current flowing in the on-condition, and the electronic circuitry can be supplied with the supply voltage from the a-c voltage or from the load a-c current.

With the foregoing and other objects in view there is provided, in accordance with the invention, an electronic sensor on/off switch for a load connected to an a-c supply network in the form of a two-wire line, comprising a controlled semiconductor switch such as a triac connected in a series circuit with the load, a sensor in the form of a touch switch for switching the load on and off, a control circuit connected from the sensor to the switch, the switch being addressable by the control circuit in a conducting state with the load switched on by a signal holding the switch in the conducting state at the zero crossing of a current passing through the load, and in a non-conducting state with the load disconnected by a signal switching the switch into the conducting state for switching on the load at the zero crossing of an output a-c voltage at the switch, a power supply circuit connected to the control circuit, a current transformer having a primary and a secondary winding and being operable in saturation, the current transformer being connected in series with the switch, the control circuit including a first rectifier being coupled to the secondary winding and having an output producing a supply voltage with the switch in the conducting state relative to a reference potential equal to a reference potential point of the output a-c voltage, and a branch of the series circuit including the primary winding, the switch, a storage capacitor chargeable by the output a-c voltage and a second rectifier producing the supply voltage in the non-conducting state.

In accordance with another feature of the invention, the first rectifier is a full-wave rectifier.

In accordance with a further feature of the invention, there is provided a zener diode shunted across the second rectifier and the storage capacitor.

In accordance with an added feature of the invention, there is provided a series resistor connected in the branch of the series resistor between the second rectifier and the switch.

In accordance with an additional feature of the invention, the switch has a control electrode, the sensor is operable to produce an on-signal, and the control circuit comprises a voltage zero crossing detector for delivering a pulse-shaped output signal as a function of the zero crossings of the output a-c voltage if the switch is in the non-conducting state and the load is switched off, a logic circuit operable by receiving the on-signal from the sensor and the pulse-shaped signal output signal for feeding the pulse-shaped output signal to the control electrode, and a current zero crossing detector connected to the secondary winding for transforming voltage at the secondary winding into a pulse-shaped output signal, the voltage zero crossing detector being disconnected from the control electrode and the pulse-shaped output signal of the current zero crossing detector being connected to the control electrode by the logic circuit when the switch is in the conducting state.

In accordance with yet another feature of the invention, the voltage zero crossing detector comprises a first transistor having an emitter receiving the reference potential point of the output a-c voltage, a working resistance connected to the collector of the first transistor and receiving the supply voltage, a voltage divider receiving the output a-c voltage and having a tap connected to the base of the first transistor, a second transistor having an emitter connected to the tap of the voltage divider, a collector connected to the working resistor in common with the first transistor, and a base receiving the reference potential point of the output a-c voltage, a third transistor having an emitter receiving the reference potential point of the output a-c voltage, another working resistor connected to the collector of the third transistor and receiving the supply voltage, the base of the third transistor being connected to the common connection of the collectors of the first and second transistors to the first-mentioned working resistor, the voltage divider being operable to switch the first and second transistor into conduction at given negative and positive values in the region of the zero crossing of the output a-c voltage, and an output connected to the collector of the third transistor for producing the pulse shaped output signal between the output and the reference potential point of the output a-c voltage.

In accordance with yet a further feature of the invention, the current zero crossing detector further comprises a first input transistor having a base forming a first input terminal, a first resistor being connected to the base of the first input transistor and receiving the supply voltage, the emitter of the first input transistor receiving the reference potential point of the output a-c voltage, a second working resistor being connected to the collector of the first input transistor and receiving the supply voltage, a second input transistor having a base forming a second input terminal, a third resistor being connected to the base of the second input transistor and receiving the supply voltage, the emitter of the second input transistor receiving the reference potential point of the output a-c voltage, a fourth working resistor being connected to the collector of the second input transistor and receiving the supply voltage, two output transistors each having a base connected to the collector of one of the first and second input transistors and an emitter receiving the reference potential point of the output a-c voltage, a fifth working resistor being connected in common to the collectors of the output transistors and receiving the supply voltage, and an output connected to the collectors of the output transistors for producing the pulse-shaped output signal between the output and the reference potential point of the output a-c voltage.

In accordance with yet an added feature of the invention, there is provided a diode connected from each of the input terminals to the secondary winding of the current transformer.

In accordance with yet an additional feature of the invention, there is provided a monostable multivibrator connected between the current zero crossing detector and the logic circuit for adjusting a given pulse width of the pulse-shaped output signal.

In accordance with still another feature of the invention, the monostable multivibrator and the voltage zero crossing detector each include an output, and the logic circuit comprises a flip-flop having a setting input connected to the output of the monostable multivibrator, a resetting input and a complimentary output, an inverter connected from the resetting input to the output of the voltage zero crossing detector, a first AND gate having one input connected to the complimentary output of the flip-flop, and another input connected to the output of the voltage zero crossing detector, an OR gate having one input connected to an output of the first AND gate and another input connected to the output of the monostable multivibrator, and a second AND gate having one input connected to the output of the OR gate, another input connected to the sensor and an output connected to the control electrode of the switch.

In accordance with still a further feature of the invention, there is provided a pre-amplifier connected to the sensor, a time delay stage connected to the pre-amplifier, a second flip-flop having a control input connected to the time delay stage and an output connected to the other input of the second AND gate.

In accordance with still an added feature of the invention, the logic circuit further comprises another monostable multivibrator having an input connected to the output of the first-mentioned monostable multivibrator and an output, another OR gate having an input connected to the output of the other monostable multivibrator, another input connected to the output of the second AND gate, and an output connected to the control electrode.

In accordance with a concomitant feature of the invention, the switch has a control electrode, the sensor is operable to produce an on-signal, and the control circuit comprises a voltage zero crossing detector for delivering a pulse-shaped output signal as a function of the zero crossings of the output a-c voltage if the switch is in the non-conducting state and the load is switched off, a logic circuit operable by receiving the on-signal from the sensor and the pulse-shaped output signal for feeding the pulse-shaped output signal to the control electrode, the logic circuit comprising an AND gate having an input connected to the voltage zero crossing detector, and another input connected to the sensor, an inverter having an input connected to the sensor and an output, a flip-flop having a setting input connected to the output of the AND gate, a resetting input connected to the output of the inverter, and an output being controlled by the setting input and connected to the control electrode.

Other features which are considered as characteristic for the invention are set forth in the appended claims.

Although the invention is illustrated and described herein as embodied in an electronic sensor on/off switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 6 is a schematic circuit diagram of an embodiment of a current zero crossing detector for the electronic sensor on/off switch according to FIG. 1;

Figure 8:
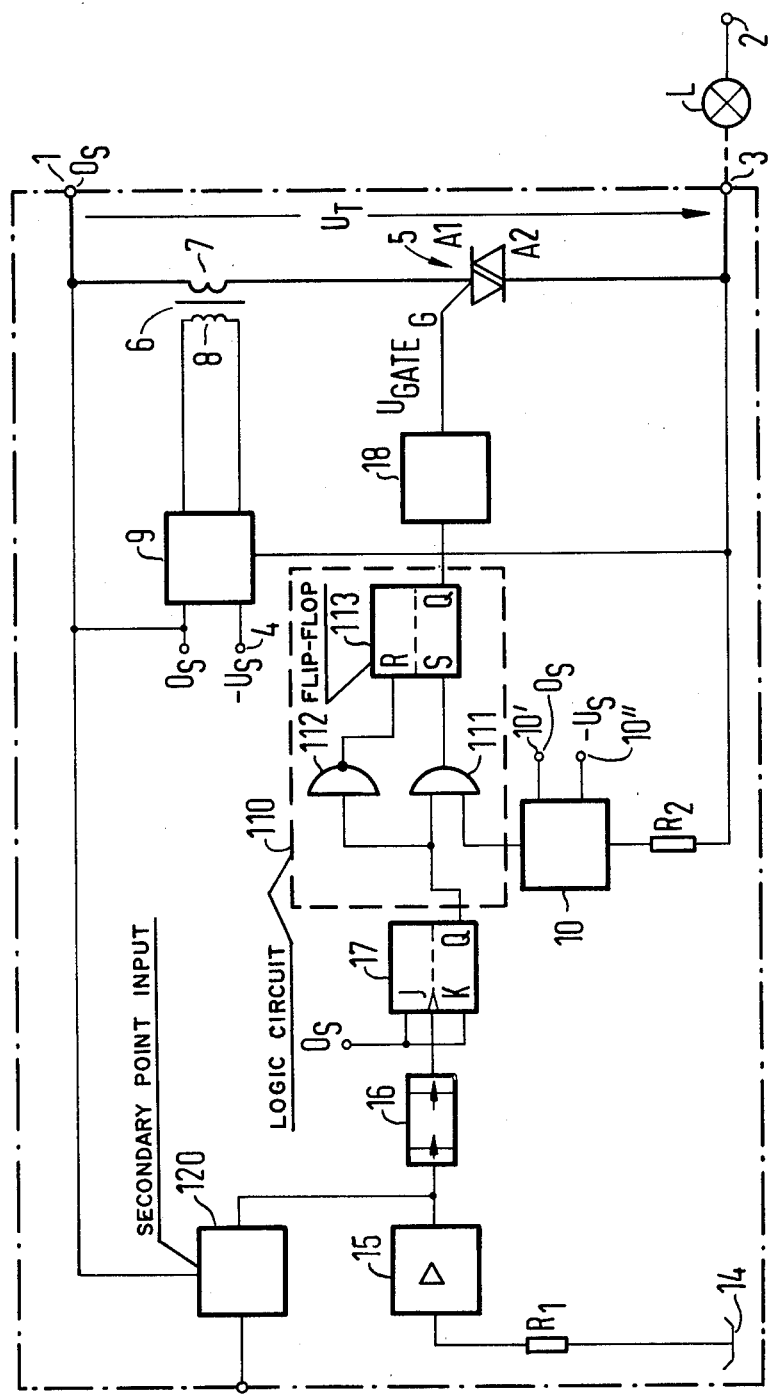

FIGS. 7A to 7E, respectively, are signal diagrams for explaining the operation of the current zero crossing detector according to FIG. 6; and FIG. 8 is a schematic circuit diagram of a further embodiment of an electronic sensor on/off switch according to the invention.

Reference will now be made to the figures of the drawing and first, particularly, to a first embodiment of the electronic sensor on/off switch according to the invention, which is now being described with reference to the block diagram of FIG. 1 as well as to the signal diagrams of FIGS. 2A to 2H.

Figure 1:
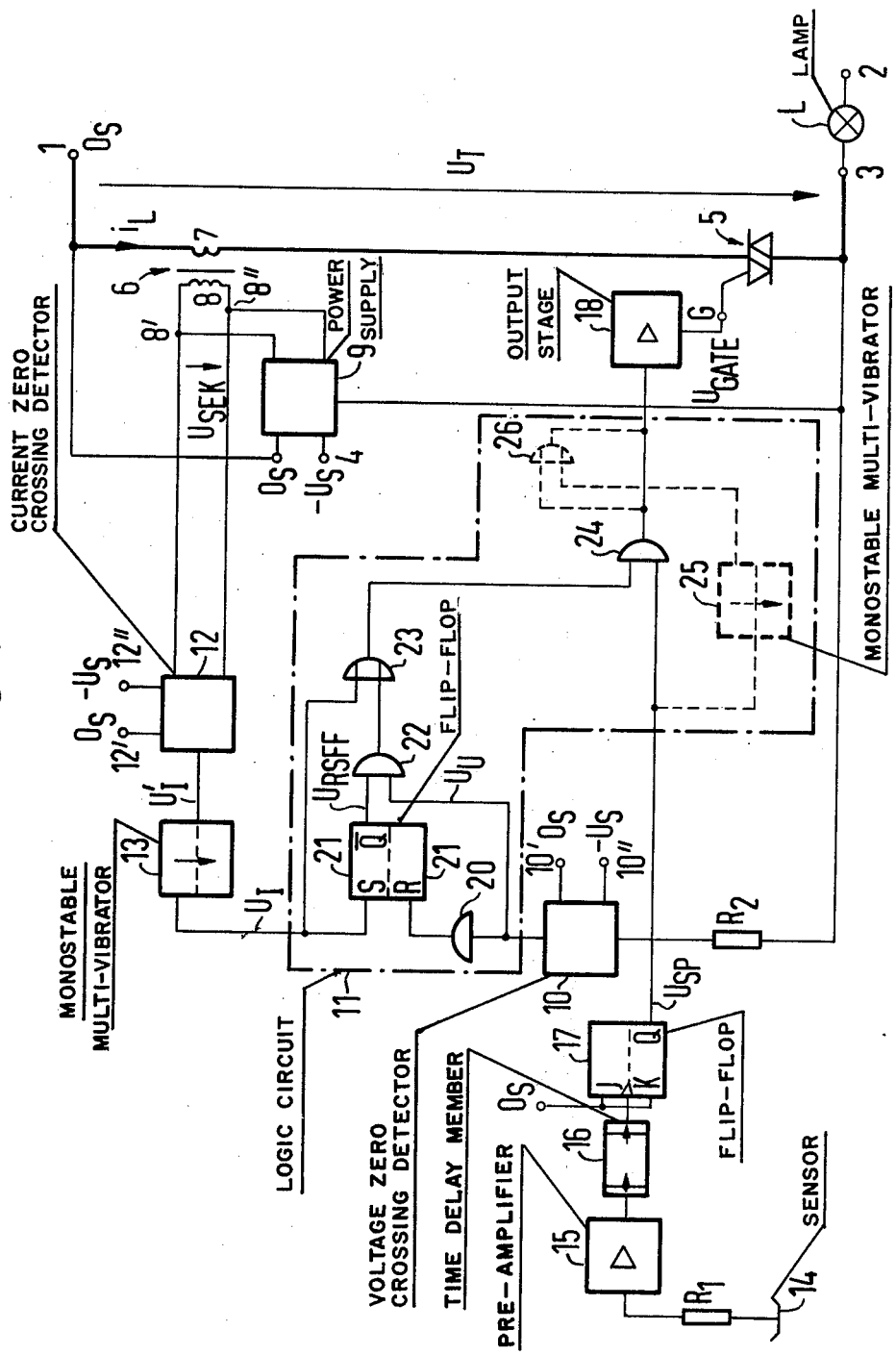
FIG. 1 is a schematic circuit diagram of a first embodiment of an electronic sensor on/off switch according to the invention.

According to the block diagram of FIG. 1, it is seen that an a-c supply network in the form of a two-wire line is connected to the terminals 1 and 2. Connected to this a-c network in series are a lamp L forming a load, a controlled semiconductor switch in the form of a triac 5, and a primary winding 7 of a current transformer 6. With the triac 5 cut off, an a-c voltage drop $U_T$ is present between the terminal 1 and a terminal 3 at the series circuit comprising the primary winding 7 of the current transformer 6 and the triac 5. On the other hand, with the triac 5 conducting, a load current $i_L$ flows through the series circuit comprising the primary winding 7 of the current transformer 6, the triac 5 and the lamp L. As will be explained in detail hereinbelow with reference to the diagrams of FIGS. 2A to 2H, the voltage $U_T$ is referred to the reference potential $O_S$ at the terminal 1, so that the terminal 3 can be designated as the output of the electronic sensor on/off switch. The a-c voltage $U_T$ is therefore designated as the output a-c voltage.

As already explained hereinafore, it is important for the operation of the electronic sensor on/off switch that the switching processes are referred to the zero crossing of the voltage $U_T$ and the current $i_L$, respectively. For this purpose, a voltage zero crossing detector 10 as well as a current zero crossing detector 12 are provided in the circuit according to FIG. 1. The voltage zero crossing detector 10 is coupled to the output terminal 3 through a resistor $R_2$, while the current zero crossing detector 12 is coupled to the secondary winding 8 of the current transformer 6. To ensure the power supply in the switched-off as well as in the switched-on state, a power supply 9 is provided according to the invention. This power supply 9 which will be explained in detail later on, is likewise coupled on the input side to the secondary winding 8 of the current transformer 6. This power supply circuit provides a supply voltage $-U_S$ at an output terminal 4 in a manner to be described in detail later on. A further output terminal of the power supply circuit 9 is connected to the terminal 1 so that the reference potential $O_S$ is available at that output terminal of the power supply circuit 9. The reference potential $O_S$ is fed to the voltage zero crossing detector 10 at a terminal 10', and to the current zero crossing detector 12 at a terminal 12'. The supply voltage $-U_S$ is fed to a terminal 10'' at the voltage zero crossing detector 10, and to a terminal 12'' at the current zero crossing detector 12.

In order to address the triac 5 at its gate G with the gate voltage $U_{GATE}$, the output signals of the voltage zero crossing detector 10, the current zero crossing detector 12 as well as a switching signal from a sensor 14, are interlinked through a logic circuit 11 and are fed to the gate G of the triac 5 through an output stage 18 formed by an amplifier. The current zero crossing detector 12 is followed by a monostable multi-vibrator 13, through which a pre-determined pulse width for the pulses addressing the gate G of the triac 5 can be adjusted. The voltage zero crossing 10, logic circuit 11 and current zero crossing detector 12, together form a control circuit for addressing the switch 5.

The switching signals of the sensor 14 are applied through a resistor $R_1$, a pre-amplifier 15 and a time delay member 16 to an on and off JK-flip-flop 17. The output signal Q of the flip-flop 17 is fed to the logic circuit 11. The time delay stage serves for eliminating switching disturbances and has a delay time of, for instance, about 0.06 sec.

The logic circuit 11 contains a flip-flop 21 which is addressed at a setting input S by the output signal $U_I$ of the monostable multi-vibrator 13, and at a re-setting input R through an inverter 20 by the output signal $U_U$ of the voltage zero crossing detector 10. An AND gate 22 is addressed at one input thereof by an output signal $U_{RSFF}$ from a complementary output Q of the flip-flop 21 and, at a further input by the output signal $U_U$ of the voltage zero crossing detector 10. The output of the AND gate 22 is brought to one input of the OR gate 23 which is addressed at a further input by the output signal $U_1$ of the monostable multi-vibrator 13. The output of the OR gate 23 is fed to one input of a further AND gate 24 which is connected at a second input thereof to the output Q of the flip-flop 17. The output of the AND gate 24 is coupled to the gate G of the triac 5 through the output stage 18, provided in the form of an amplifier.

The operation of the hereinafore-described electronic sensor on/off switch is as follows: It is initially assumed that no on-signal is fed to the circuit by the sensor 14. According to FIG. 2C, the flip-flop 17 is then in a stage in which a signal $U_{SP}$ of low level is delivered to its output Q. The AND gate 24 in the logic circuit 11 is therefore cut off so that a gate voltage $U_{GATE}$ at reference potential $O_S$ is present at the gate G of the triac 5 according to FIG. 2D. The triac 5 is therefore cut off. The output voltage $U_T$ therefore drops between the terminals 1 and 3 according to FIG. 2A.

Figure 2:
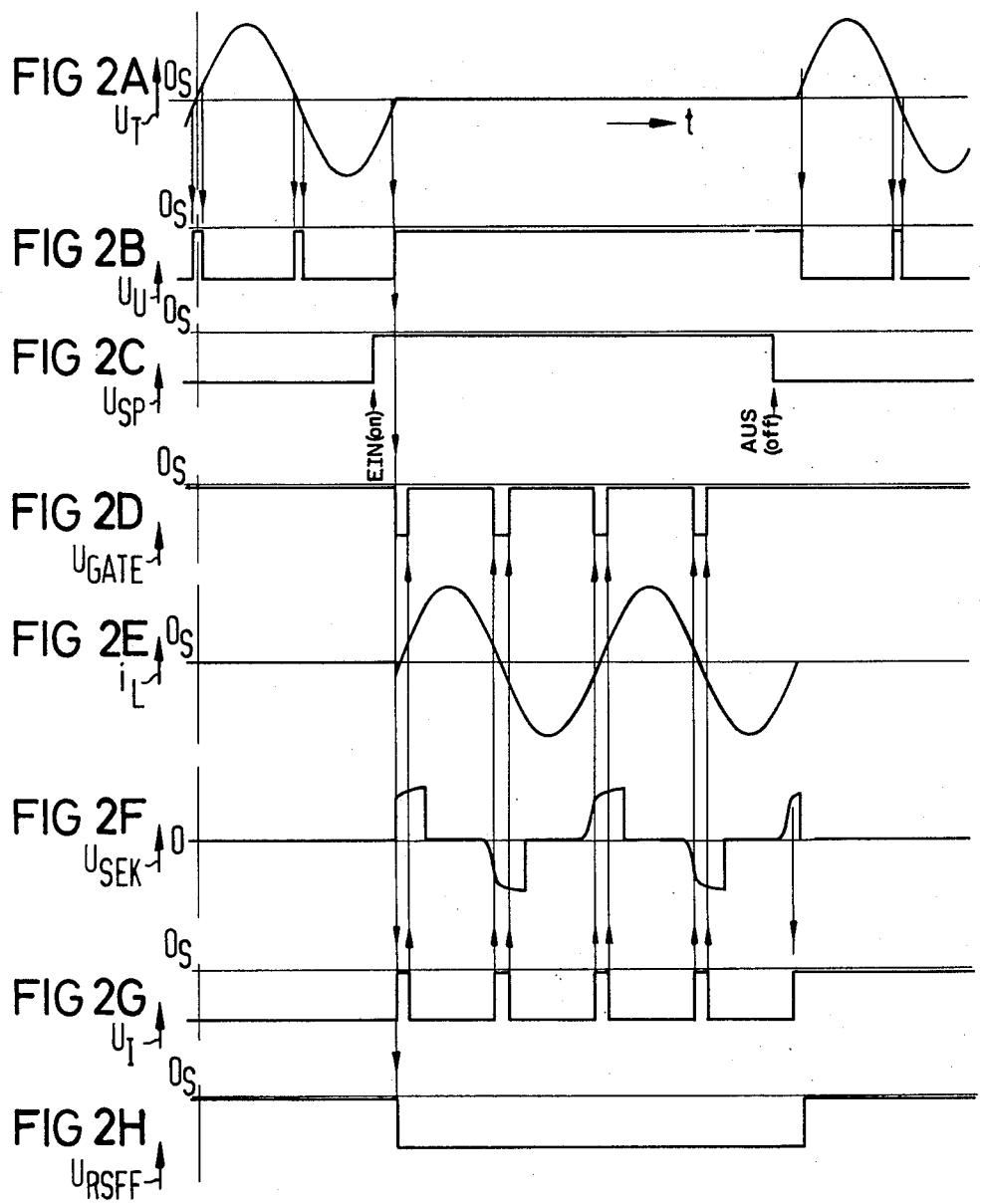
FIGS. 2A to 2H are, respectively, signal diagrams for explaining the operation of the electronic sensor on/off switch according to FIG. 1.

According to FIG. 2B, the voltage zero detector 10 generates a pulse-shaped output signal $U_U$ at the zero crossings of the voltage $U_T$. This signal jumps at the zero crossings from a low level to the reference potential level $O_S$. According to FIG. 2E, the load current $i_L$ is equal to zero, so that also the secondary voltage $U_{SEK}$ at the secondary winding 8 of the current transformer 6 is equal to zero, according to FIG. 2F. Since the output voltage $U'_I$ of the current zero crossing detector 12 is at a low level, no driving signals are delivered to the monostable multi-vibrator 13 so that its output signal and therefore the output signal $U_I$ of the monostable multivibrator 13 is at low level according to FIG. 2G. The flip-flop 21 is re-set by the pulse-shaped output signal $U_U$ of the voltage zero crossing detector 10 after it has been inverted by the inverter 20. Therefore a signal according to FIG. 2H is present at its output Q at a high level (reference potential level $O_S$).

The AND gate 22 is therefore switched into the operative state, so that it transmits the pulse-shaped output signal $U_U$ of the voltage zero crossing detector 10 to the OR gate 23, which in turn transmits the signal to the AND gate 24. Since, however, the signal $U_{SP}$ at the output Q of the flip-flop 17 is at a low level according to FIG. 2C, the AND gate 24 remains blocked so that the pulse-shaped output signal $U_U$ cannot be transmitted to the gate G of the triac 5.

It will now be assumed that through the sensor 14 an on-signal is fed into the circuit at a point in time which is designated by EIN(on) in FIG. 2C. This on-signal is transferred into the flip-flop 17 so that the signal $U_{SP}$ at its output Q jumps to a high level (reference potential level $O_S$). As can be seen from a comparison of FIGS. 2A and 2C, the on-time can be at an instant different from the zero crossing of the voltage $U_T$. The output signal $U_{SP}$ of the flip-flop 17, which is now at a high level, activates the AND gate 24. At the next zero crossing of the voltage $U_T$ following the instant of switching on, the output signal $U_U$ of the voltage zero crossing detector 10 jumps to a high level (reference potential level $O_S$), which is now transmitted through the activated AND gate 24 to the gate G of the triac 5 so that the latter is switched into conduction. Therefore load current $i_L$ flows in the circuit between the terminals 1 and 2 according to FIG. 1, as can be seen in FIG. 2E.

The zero crossings of the now flowing load current $i_L$ are transformed by the current transformer 6 according to FIG. 1 into a pulse-shaped signal $U_{SEK}$ according to FIG. 2F. This is brought about by the fact that the current transformer 6 is operated in saturation. From this pulse-shaped secondary voltage $U_{SEK}$ at the secondary winding 8 of the current transformer 6, the current zero crossing detector 12 and the monostable multi-vibrator 13 connected thereto generate a pulse-shaped signal $U_I$ according to FIG. 2G. This signal is transmitted through the OR gate 23 and the AND gate 24 made operative by the on-signal $U_{SP}$ according to FIG. 2C, and through the output stage 18, to the gate G of the triac 5. At the same time, the flip-flop 21 is set by the signal $U_I$ which is fed to its setting input, so that the signal $U_{RSFF}$ at its output Q drops to a low level according to FIG. 2H and therefore the AND gate 22 is cut off.

Since, with the load current $i_L$ flowing, the voltage $U_T$ becomes zero according to FIG. 2A, with the sensor on/off switch according to FIG. 2B switched on, the voltage zero crossing detector 10 supplies a constant output signal $U_U$ at a high level, this signal is not transmitted because the AND gate 22 is cut off.

If, at a later point in time, designated in FIG. 2C by AUS (off), the sensor on/off switch is switched off again by renewed operation of the sensor 14, then the signal conditions according to FIGS. 2A to 2H which were already explained above for the switched-off state recur.

If the load L according to FIG. 1 is a fluorescent lamp, a compensation must be made until such a fluorescent lamp has been completely fired, since the full load current $i_L$ cannot flow up to the instant of firing. According to a variant shown in FIG. 1 by dotted lines, an additional possibility is provided in the logic circuit 11 for continuously switching on such fluorescent lamps, in order to address the triac 5 for a predetermined initial period of time of, say, a second, after switching-on with a gate voltage $U_{GATE}$. For this purpose, a monostable multi-vibrator 25, having an output thereof brought to an input of an OR gate 26, is connected to the output Q of the flip-flop 17. A further input of this OR gate 26 is connected to the output of the AND gate 24. The output of the OR gate 26 is coupled through the output stage 18 to the gate G of the triac 5. If the sensor 14 delivers an on-signal through the output Q of the flip-flop 17 then, in accordance with its time constant chosen for the pre-determined initial time period, the monostable multi-vibrator 25 delivers a corresponding signal which is continuously fed from its output to the gate G of the triac 5 through the OR gate 26 and the output stage 18. In this way, the triac 5 is continuously kept in its conducting state for the pre-determined initial time period, until the fluorescent lamp forming the load L is fully ignited.

Figure 3:
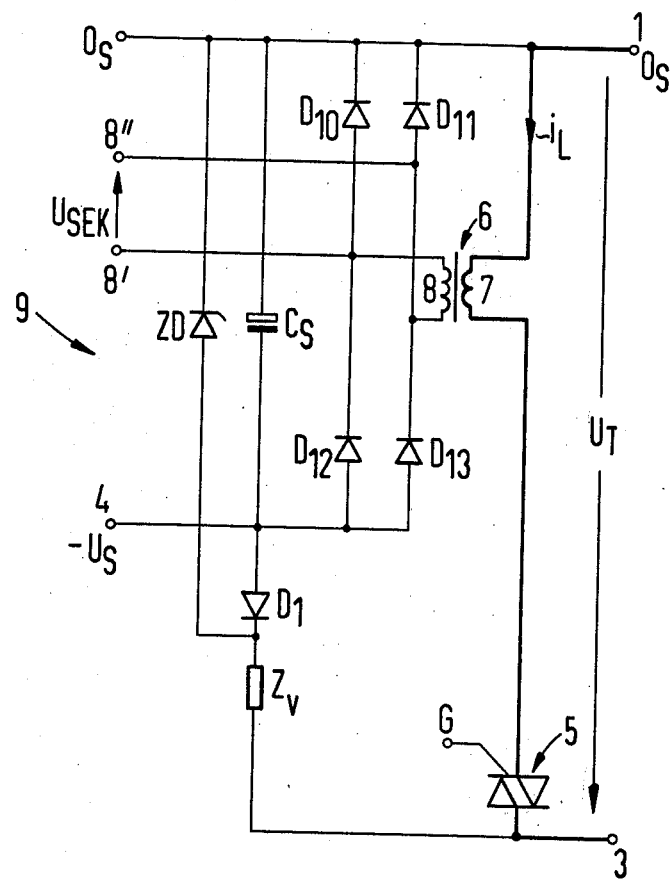
FIG. 3 is a schematic circuit diagram of an embodiment of an operating voltage supply circuit for the electronic sensor on/off switch according to FIG. 1.

The following is a description of the operating voltage supply according to the invention for the electronic circuitry of the electronic sensor on/off switch according to FIG. 1, by referring to FIG. 3, in which the same elements as in FIG. 1 are provided with the same reference symbols.

It will first be assumed that the electronic sensor on/off switch is switched off so that the output voltage $U_T$ is present between the terminals 1 and 3. For this case, there is provided a branch connected between the terminals 1 and 3, in the power supply circuit 9. The branch is a series circuit formed by a storage capacitor $C_S$, a rectifier in the form of a diode $D_1$, and a series resistor $Z_V$. A voltage stabilizing Zener diode ZD is connected in shunt to the series circuit formed of the storage capacitor $C_S$ and the diode $D_1$. With the triac 5 cut off, the storage capacitor $C_S$ is charged up from the output voltage $U_T$, so that the supply voltage $-U_S$ can be taken off at a junction point between the storage capacitor $C_S$ and the diode $D_1$. The junction point forms the terminal 4, with respect to the terminal 1 which forms the reference potential point $O_S$.

The series resistor $Z_V$ serves for limiting the current and can be formed, for instance, by a purely ohmic resistance or by an RC member.

If the triac 5 is switched into the conducting state in line with the explanations pertaining to the circuit according to FIG. 1, then the load current $i_L$ flows, whereby the secondary voltage $U_{SEK}$ is induced in the secondary winding 8 of the current transformer 6, which is operated in saturation. A rectifier which is preferably constructed as a full-wave rectifier and which is formed by the diodes $D_{10}$, $D_{11}$, $D_{12}$ and $D_{13}$ is connected to the secondary winding 8. The output of this rectifier is connected to the terminals 1 and 4. The rectifier rectifies the secondary voltage $U_{SEK}$ and thereby generates, in the on condition of the electronic sensor on/off switch, the supply voltage $-U_S$ at the terminal 4, with respect to the terminal 1 forming the reference potential point $C_S$.

Figure 4:
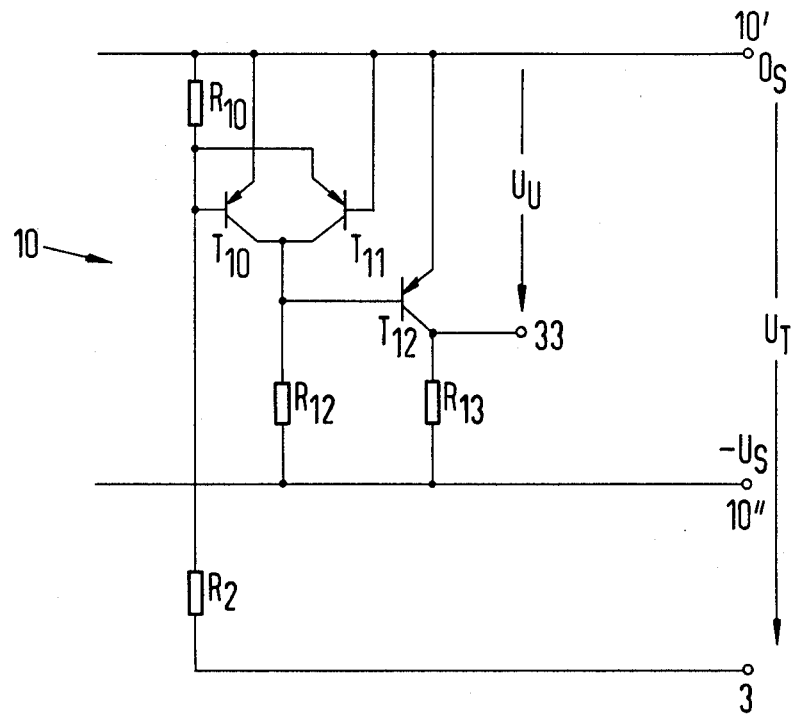
FIG. 4 is a schematic circuit diagram of an embodiment of a voltage zero crossing detector for the electronic sensor on/off switch according to FIG. 1.

The following is a description of an embodiment of the voltage zero crossing detector 10 according to FIG. 1, with reference to FIG. 4.

Between the terminals 10' and 3 of this voltage zero crossing detector, the output a-c voltage $U_T$ which has already been explained with reference to FIGS. 1 and 2A to 2H is present. The supply voltage $-U_S$ is fed-in at the terminal 10''. The voltage zero crossing detector contains two transistors $T_{10}$ and $T_{11}$. The collectors of the transistors are directly tied together and are connected through a working resistance $R_{12}$ to the supply voltage $-U_S$. The emitter of the transistor $T_{10}$ and the base of the transistor $T_{11}$ are directly connected to the terminal 10' which carries the reference potential $O_S$. The base of the transistor $T_{10}$ and the emitter of the transistor $T_{11}$ are connected to the tap of a voltage divider, which is formed by the resistor $R_{10}$ and the resistor $R_2$ which was already mentioned in connection with FIG. 1. This voltage divider is connected between the terminal 10' and the output terminal 3.

An output transistor $T_{12}$ is connected by its base to the junction point of the collectors of the transistors $T_{10}$ and $T_{11}$ and the working resistance $R_{12}$. The emitter of the transistor $T_{12}$ is connected directly to the terminal 10' carrying the reference potential $O_S$, while its collector is connected through a working resistance $R_{13}$ to the terminal 10'' carrying the supply voltage $-U_S$. The junction point of the collector of the transistor $T_{12}$ and the working resistor $R_{13}$ forms an output 33 of the voltage zero crossing detector; the pulse-shaped output signal $U_U$ of the voltage zero crossing detector 10 can be taken off between the terminal 10' and this output 33.

The operation of this embodiment of the voltage zero crossing detector will be explained with reference to the diagram of FIG. 5, which shows in its upper part the sinusoidal output a-c voltage $U_T$. This output voltage $U_T$ present at the output terminal 3, referred to the reference potential $O_S$ at the terminal 10' as a function of time. The lower part shows the pulse-shaped output signal $U_U$ as a function of time.

It will first be assumed, that the output voltage $U_T$ is larger during its negative half-wave than a threshold voltage $-U_{SS}$. For these values of the output voltage $U_T$, the transistor $T_{10}$ is fully driven into conduction so that its collector is practically at the reference potential $O_S$ present at the terminal 10'. Meanwhile the transistor $T_{11}$ is cut off because its emitter is at the same negative potential as the base of the transistor $T_{10}$. Since the base of the transistor $T_{12}$ is practically at the reference potential $O_S$ present at the terminal 10' by virtue of the fully conducting transistor $T_{10}$, then the transistor $T_{12}$ is cut off, so that practically the entire supply voltage $-U_S$ drops across it. Therefore the output signal $U_U$ is at the negative (low) level according to the lower diagram in FIG. 5.

Figure 5:
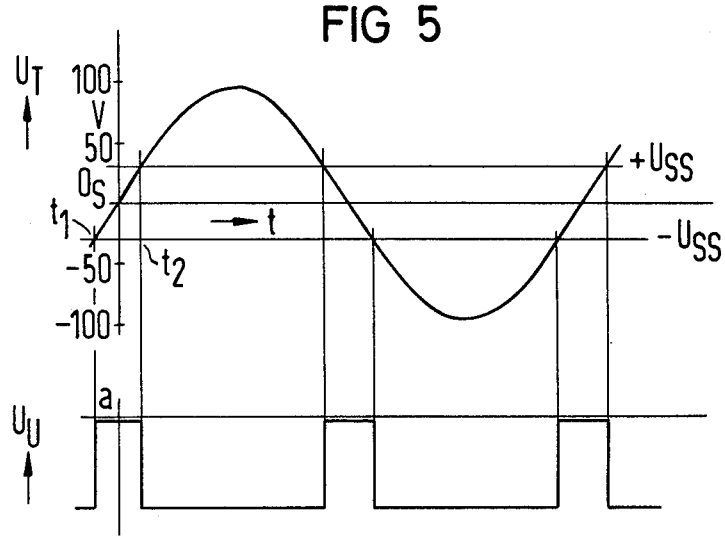
FIG. 5 is a signal diagram for explaining the operation of the voltage crossing detector according to FIG. 4.

If the output voltage $U_T$ according to the upper diagram in FIG. 5 now reaches the negative threshold value $-U_{SS}$ during its negative half-wave at a point in time $t_1$, then the transistor $T_{10}$ is cut off and the transistor $T_{11}$ still remains blocked because its emitter is still at a more negative potential relative to the reference potential $O_S$ present at the terminal 10′. The transistor $T_{12}$ can now draw current through its emitter-base path and the resistor $R_{12}$, so that it conducts fully. Its collector potential thereby becomes equal to the reference potential $O_S$ at the terminal 10′, so that the output signal $U_U$ jumps to the reference potential level $O_S$, according to the lower diagram in FIG. 5.

If the voltage $U_T$ reaches a positive threshold $+U_{SS}$ during its positive halfwave at a point in time $t_2$, the emitter of the transistor $T_{11}$ becomes more positive than the base connected to reference potential $O_S$ at the terminal 10′, so that the transistor $T_{11}$ is driven into conduction. The transistor $T_{10}$ remains cut off, because its base is at a potential more positive than its emitter. Because the transistor $T_{11}$ conducts, the base of the transistor $T_{12}$ is now pulled again to the reference potential $O_S$, so that this transistor is cut off again and the output voltage $U_U$ again jumps to the negative (low) level.

The process is repeated accordingly at all zero crossings of the output voltage $U_T$.

Following is a description of the embodiment of the current zero crossing detector 12 according to FIG. 1, with reference to FIGS. 6 and 7A to 7E. To explain the operation of this current zero crossing detector, the load circuit with the triac 5 and the current transformer 6 as well as the power supply circuit 9 according to FIG. 3 are shown once more in FIG. 6.

The current zero crossing detector 12 is connected through input diodes $D_{20}$ and $D_{21}$ to the secondary voltage $U_{SEK}$ of the current transformer 6 (terminals 8′ and 8″ also shown in FIG. 1). These diodes $D_{20}$ and $D_{21}$ are each connected to the base of a transistor $T_{20}$ and $T_{21}$, respectively; the bases of these transistors are each further connected through a resistor $R_{20}$ and $R_{22}$, respectively, to the supply voltage $-U_S$. The emitters of these two transistors $T_{20}$ and $T_{21}$ are connected directly to the reference potential $O_S$ (at terminal 1), while their collectors are each connected through a resistance $R_{21}$ and $R_{24}$, respectively, to the supply voltage $-U_S$ (at terminal 4). The transistors $T_{20}$ and $T_{21}$ are followed by transistors $T_{22}$ and $T_{23}$, respectively, the bases of which are connected to the collector of the transistor $T_{20}$ and the transistor $T_{21}$, respectively. The emitters of the transistors $T_{22}$ and $T_{23}$ are likewise connected directly to the reference potential $O_S$ (at terminal 1), while the collectors are each connected through a resistor $R_{23}$ to the supply voltage $-U_S$ (at terminal 4). The output signal $U'_I$ as referred to terminal 1 (reference potential $O_S$) can be taken off at an output 32 of the current zero crossing detector 12.

The operation of the above-described current zero crossing detector 12 will be described in conjunction with the signal diagrams according to FIGS. 7A to 7E. First, the positive half-wave of the load current $i_L$ according to FIG. 7A will be considered. At the secondary winding 8 of the current transformer 6, the secondary voltage $U_{SEK}$ is then present, with a polarity at which the terminal 8′ is positive relative to the terminal 8″. Since the current transformer 6 is operated in saturation, the secondary voltage $U_{SEK}$ has a shape in accordance with FIG. 7B where a positive voltage pulse characterizing the zero crossing of the load current, is generated during the positive half-wave of the load current $i_L$.

The operation of the above-described current zero crossing detector will now be further described in conjunction with the signal diagrams according to FIGS. 7A to 7E. Again since the current transformer 6 is operated in saturation, a pulse-shaped secondary voltage $U_{SEK}$ is generated at its secondary winding 8 in accordance with FIG. 7B, with pulses at the zero crossings of the load current $i_L$ according to FIG. 7A. This follows from the fact that the magnetic induction in the core of the current transformer has a very steep slope as a function of the magnetic field in a narrow area around zero and reaches saturation outside of this narrow region.

First, the region will be considered in which the secondary voltage $U_{SEK}$ is at reference potential $O_S$ between two pulses according to FIG. 7B, i.e., the voltage between the terminals 8′ and 8″ in FIG. 6 is equal to zero. Therefore, the transistors $T_{20}$ and $T_{21}$ in the current zero crossing detector according to FIG. 6, can draw current through their base-emitter path and through the resistors $R_{20}$ and $R_{22}$, respectively, whereby they are switched into conduction. The bases of the transistors $T_{22}$ and $T_{23}$ are then practically at reference potential $O_S$ at the terminal 1, so that these transistors are cut off. The voltages $U_1$ and $U_2$ at the transistors $T_{20}$ and $T_{21}$ are therefore equal to the reference potential $O_S$, while the output signal $U'_I$ of the current zero crossing detector 12 is equal to the supply voltage $-U_S$ because the transistors $T_{22}$ and $T_{23}$ are cut off, i.e. this output signal is at a low level according to FIG. 7E.

In the first zero crossing of the load current $i_L$ shown in FIG. 7A, a positive pulse of the secondary voltage $U_{SEK}$ now appears according to FIG. 7B. Since the load current $i_L$ is referred to the reference potential $O_S$ at the terminal 1, the positive potential at the terminal 8″ is transferred through the diode $D_{20}$ to the base of the transistor $T_{20}$, so that the latter is cut off. Therefore the voltage $U_1$ at the transistor $T_{20}$ according to FIG. 7C practically jumps to the value of the supply voltage $-U_S$. Now, the transistor $T_{22}$ can draw current through its emitter-base path and the resistor $R_{21}$, so that it is switched into conduction. Because of this the output signal $U'_I$ jumps to the reference potential $O_S$ according to FIG. 7E.

At the next zero crossing of the load current $i_L$ according to FIG. 7A, the polarity of the pulse of the secondary voltage $U_{SEK}$ is reversed according to FIG. 7B. Now, the positive potential at the terminal 8′ is transferred through the diode $D_{21}$ to the base of the transistor $T_{21}$, so that this transistor is cut off and the voltage $U_2$ jumps practically to the supply voltage $-U_S$ according to FIG. 7D. Thus, the transistor $T_{23}$ can draw current through its emitter-base path and the resistor $R_{24}$, so that it is switched into conduction and the output signal $U'_I$ again jumps to the reference potential $O_S$ according to FIG. 7E.

The process is repeated similarly for all zero crossings of the load current $i_L$.

FIG. 8, in which like elements as in FIG. 1 are provided with the same reference symbols, shows a further embodiment of the sensor on/off switch according to the invention. With respect to the components of the sensor on/off switch already explained in connection with FIG. 1, the explanation in connection with FIG. 1 are referred to. In the embodiment according to FIG. 8, the gate G of the triac 5 is addressed through a continuous signal $U_{GATE}$. For this purpose, a logic circuit 110 contains an AND gate 111, having one circuit thereof connected to the output of the hereinafore-explained voltage zero crossing detector 10 and having another input thereof connected to the hereinafore-explained flip-flop 17. The output Q of the flip-flop 17 is further coupled through an inverter 112 to a resetting input R of a flip-flop 113, while the output of the AND gate 111 is coupled to a setting input S of the flip-flop 113. An output Q of the flip-flop 113 is coupled to the gate G of the triac 5 through the previously explained output stage 18.

If the sensor 14 is operated for switching on, the flip-flop 17 is set and supplies an output signal at its output Q, by way of which the AND gate 111 is switched into the operative state. At the next zero crossing of the voltage $U_T$ between the terminals 1 and 3, the voltage zero crossing detector 10 delivers a pulse-shaped output signal in the manner explained in connection with FIGS. 1, 3 and 4. The output signal is transmitted through the AND gate 111 to the setting input S of the flip-flop 113, whereby this flip-flop is set. The output signal then present at its output Q is transmitted through the output stage 18 to the gate G of the triac 5. This switching state is maintained continuously until the sensor 14 is again operated for switching off the load L. The flip-flop 17 is then reset, so that its output Q drops to a low level. This low level is inverted by the inverter 112, so that the flip-flop 113 is reset, i.e. the output Q of this flip-flop drops to a low level so that the control signal $U_{GATE}$ at the gate G of the triac 5 disappears, whereby the triac is cut off and the load is switched off.

If it is to be possible to also switch the sensor on/off switch from another point (secondary point), then a secondary point input 120 which is inserted into the overall circuit ahead of the time delay member 16 can be provided. The on/off switch can then also be switched on and off from another point through a sensor corresponding to the sensor 14.

There are claimed:

1. Electronic sensor on/off switch for a load connected to an a-c supply network, comprising a controlled semiconductor switch connected in a series circuit with the load, a sensor for switching the load on and off, a control circuit connected from said sensor to said switch, said switch being addressable by said control circuit in a conducting state with the load switched on by a signal holding said switch in the conducting state at the zero crossing of a current passing through the load, and in a non-conducting state with the load disconnected by a signal switching said switch into the conducting state for switching on the load at the zero crossing of an output a-c voltage at said switch, a power supply circuit connected to said control circuit, a current transformer having a primary and a secondary winding and being operable in saturation, said current transformer being connected in series with said switch, said control circuit including a first rectifier being coupled to said secondary winding and having an output producing a supply voltage with said switch in the conducting state relative to a reference potential equal to a reference potential point of the output a-c voltage, and a branch of said series circuit including said primary winding, said switch, a storage capacitor chargeable by the output a-c voltage and a second rectifier producing the supply voltage in the non-conducting state.

2. Electronic sensor on/off switch according to claim 1, wherein said first rectifier is a full-wave rectifier.

3. Electronic sensor on/off switch according to claim 2, including a Zener diode shunted across said second rectifier and said storage capacitor.

4. Electronic sensor on/off switch according to claim 1, including a series resistor connected in said branch of said series resistor between said second rectifier and said switch.

5. Electronic sensor on/off switch according to claim 1, wherein said switch has a control electrode, said sensor is operable to produce an on-signal, and said control circuit comprises a voltage zero crossing detector for delivering a pulse-shaped output signal as a function of the zero crossings of the output a-c voltage if said switch is in the non-conducting state and the load is switched off, a logic circuit operable by receiving said on-signal from said sensor and said pulse-shaped signal output signal for feeding said pulse-shaped output signal to said control electrode, and a current zero crossing detector connected to said secondary winding for transforming voltage at said secondary winding into a pulse-shaped output signal, said voltage zero crossing detector being disconnected from said control electrode and the pulse-shaped output signal of said current zero crossing detector being connected to said control electrode by said logic circuit when said switch is in the conducting state.

6. Electronic sensor on/off switch according to claim 5, wherein said voltage zero crossing detector comprises a first transistor having an emitter receiving the reference potential point of the output a-c voltage, a working resistance connected to the collector of said first transistor and receiving the supply voltage, a voltage divider receiving the output a-c voltage and having a tap connected to the base of said first transistor, a second transistor having an emitter connected to the tap of said voltage divider, a collector connected to said working resistor in common with said first transistor, and a base receiving the reference potential point of the output a-c voltage, a third transistor having an emitter receiving the reference potential point of the output a-c voltage, another working resistor connected to the collector of said third transistor and receiving the supply voltage, the base of said third transistor being connected to the common connection of the collectors of said first and second transistors to said first-mentioned working resistor, said voltage divider being operable to switch said first and second transistors into conduction at given negative and positive values in the region of the zero crossing of the output a-c voltage, and an output connected to the collector of said third transistor for producing the pulse-shaped output signal between said output and the reference potential point of the output a-c voltage.

7. Electronic sensor on/off switch according to claim 5, wherein said current zero crossing detector further comprises a first input transistor having a base forming a first input terminal, a first resistor being connected to the base of said first input transistor and receiving the supply voltage, the emitter of said first input transistor receiving the reference potential point of the output a-c voltage, a second working resistor being connected to the collector of said first input transistor and receiving the supply voltage, a second input transistor having a base forming a second input terminal, a third resistor being connected to the base of said second input transistor and receiving the supply voltage, the emitter of said second input transistor receiving the reference potential point of the output a-c voltage, a fourth working resistor being connected to the collector of said second input transistor and receiving the supply voltage, two output transistors each having a base connected to the collector of one of said first and second input transistors and an emitter receiving the reference potential point of the output a-c voltage, a fifth working resistor being connected in common to the collectors of said output transistors and receiving the supply voltage, and an output connected to the collectors of said output transistors for producing the pulse-shaped output signal between said output and the reference potential point of the output a-c voltage.

8. Electronic sensor on/off switch according to claim 7, including a diode connected from each of said input terminals to said secondary winding of said current transformer.

9. Electronic sensor on/off switch according to claim 5 or 7, including a monostable multivibrator connected between said current zero crossing detector and said logic circuit for adjusting a given pulse width of the pulse-shaped output signal.

10. Electronic sensor on/off switch according to claim 9, wherein said monostable multivibrator and said voltage zero crossing detector each include an output, and said logic circuit comprises a flip-flop having a setting input connected to said output of said monostable multivibrator, a resetting input and a complimentary output, an inverter connected from said resetting input to said output of said voltage zero crossing detector, a first AND gate having one input connected to said complimentary output of said flip-flop, and another input connected to said output of said voltage zero crossing detector, an OR gate having one input connected to an output of said first AND gate and another input connected to said output of said monostable multivibrator, and a second AND gate having one input connected to the output of said OR gate, another input connected to said sensor and an output connected to said control electrode of said switch.

11. Electronic sensor on/off switch according to claim 10, including a pre-amplifier connected to said sensor, a time delay stage connected to said pre-amplifier, a second flip-flop having a control input connected to said time delay stage and an output connected to said other input of said second AND gate.

12. Electronic sensor on/off switch according to claim 11, wherein said logic circuit further comprises another monostable multi-vibrator having an input connected to said output of said second flip-flop and an output, another OR gate having an input connected to said output of said other monostable multivibrator, another input connected to the output of said second AND gate, and an output connected to said control electrode.

13. Electronic sensor on/off switch according to claim 1, wherein said switch has a control electrode, said sensor is operable to produce an on-signal, and said control circuit comprises a voltage zero crossing detector for delivering a pulse-shaped output signal as a function of the zero crossings of the output a-c voltage if said switch is in the non-conducting state and the load is switched off, a logic circuit operable by receiving said on-signal from said sensor and said pulse-shaped output signal for feeding said pulse-shaped output signal to said control electrode, said logic circuit comprising an AND gate having an input connected to said voltage zero crossing detector, and another input connected to said sensor, an inverter having an input connected to said sensor and an output, a flip-flop having a setting input connected to the output of the AND gate, a resetting input connected to said output of said inverter, and an output being controlled by said setting input and connected to said control electrode.

* * * * *